(12) United States Patent
Lu (10) Patent No.: US 6,344,674 B2
(45) Date of Patent: Feb. 5, 2002

(54) FLASH MEMORY USING MICRO VACUUM TUBE TECHNOLOGY

(75) Inventor: Nai-Cheng Lu, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/784,820

(22) Filed: Feb. 20, 2001

Related U.S. Application Data (62) Division of application No. 09/495,346, filed on Feb. 1, 2000, now Pat. No. 6,212,104.

(51) Int. Cl.[7] .................... G11C 16/04; H01L 29/788
(52) U.S. Cl. .................... 257/316; 257/319; 257/320; 365/185.01
(58) Field of Search ................. 365/118, 129, 365/185.01; 257/316, 319, 320

(56) References Cited

U.S. PATENT DOCUMENTS

| | | | | |
|---|---|---|---|---|
| 4,317,127 A | * | 2/1982 | Nishizawa | 257/264 |
| 4,639,753 A | * | 1/1987 | Yamada | 257/258 |
| 5,231,606 A | | 7/1993 | Gray | 365/225.6 |
| 5,651,713 A | | 7/1997 | Lee et al. | 445/50 |
| 5,731,597 A | | 3/1998 | Lee et al. | 257/10 |

* cited by examiner

Primary Examiner—Son Mai
(74) Attorney, Agent, or Firm—George O. Saile; Stephen B. Ackerman (57) ABSTRACT

In this invention a micro vacuum tube is used to form a flash memory cell. The micro vacuum tube is position over a floating gate and is used to program, erase, read and deselect the flash memory cell. A first embodiment includes a source and drain with the floating gate to provide a means to produce bit line current to be read by the flash memory sense amplifiers. In a second embodiment the source and drain are eliminated and cathode gate current is used to indicate the state of the flash memory cell. In a third embodiment the floating gate is replace with a diffusion in the semiconductor substrate. The cathode tip is formed by filling a depression in a sacrificial material used to temporarily fill the volume that will be the vacuum chamber when the vacuum tube is completed. The tip can be a convex cusp producing a needle like point or an elongated convex cusp having an sharp line edge. The two different shaped cathode tips depend on the shape of the vacuum chamber, and the elongated convex cusp produces a more efficient emission of electron.

7 Claims, 6 Drawing Sheets

|  | Program | Erase | Read | Non-select |
|---|---|---|---|---|
| Tip Gate | 0 | +10V | +5V | Float |
| Selector Gate | +5V | +5V | +5V | 0 |
| Floating Gate | e⁻ | null | e⁻/null | e⁻/null |
| S/D selector | No | No | Yes | Float |
| Substrate | 0 | 0 | 0 | 0 |

|  | Program | Erase | Read | Non-select |
|---|---|---|---|---|
| Tip Gate | 0 | +10V | −5V | Float |
| Selector Gate | +5V | +5V | +5V | 0 |
| Floating Gate | e− | null | e−/ null | e−/ null |
| Substrate | 0 | 0 | 0 | 0 |

|  | Program | Erase | Read | Non-select |
|---|---|---|---|---|
| Tip Gate | 0 | +10V | +5V | Float |
| Selector Gate | +10V | +3V | +3V | 0 |
| Substrate | −V | −V | −V | −V |

FIG. 3d

FLASH MEMORY USING MICRO VACUUM TUBE TECHNOLOGY

RELATED PATENT APPLICATION

This is a division of patent application Ser. No. 09/495,346, filing date Feb. 1, 2000 now U.S. Pat. No. 6,212,104. A Novel Flash Memory Using Micro Vacuum Tube Technology, assigned to the same assignee as the present invention.

This patent application is related to U.S. Pat. application Ser. No. 09/108,414, filing date Jul. 1, 1998 and assigned to a common assignee.

BACKGROUND OF THE INVENTION

1. Field of Invention

This invention relates to flash memories and more particularly to flash memory cells created from micro vacuum tube technology.

2. Description of Related Art

A micro vacuum tube is a cold cathode field emission device in which electrons are emitted into a vacuum at room temperature under a sufficiently high electric field. The electric field does not require a high voltage to produce emission providing that the emitting surface has a sufficiently small radius of curvature. Electrons are emitted by the cold cathode past a selector gate and collected at an anode. The anode can be a floating gate of a flash memory cell. One of the advantages of the micro vacuum tube is the small area required on the surface of a semiconductor substrate. The micro vacuum tube devices can be manufactured on the surface of a semiconductor substrate using integrated circuit techniques and finally sealing the micro vacuum tube with a layer of metalization under a vacuum.

In U.S. Pat. No. 5,731,597 (Lee et al.) a field emitter array (FEA) is incorporated with MOSFET's using common processing steps. In U.S. Pat. No. 5,651,713 (Lee et al.) describes a method for manufacture of a low voltage FEA array with minute gate holes on a semiconductor substrate. In U.S. Pat. No. 5,231,606 (Gray) is disclosed a FEA array having two or more collector electrodes, an extractor electrode, at least one deflector electrode and at least one electron field emitter.

In nonvolatile memories such as flash memories the durability of the oxide in the program and erase path is key to the longevity of the flash memory. A major issue with the development of flash memories is lessening the program and erase damage; however, it is inevitable that the oxide quality will decay and eventually end the useful life of a flash memory cell. A micro vacuum tube technology forming an FEA provides a means by which the classical degradation of an oxide does not exist because hot carriers are not used as a means to charge a floating gate. Instead a flow of electrons from a cold cathode is used to providing the charge for the floating gate.

SUMMARY OF THE INVENTION

In this invention a flash memory cell is constructed from a micro vacuum tube located over a floating gate. A sequence of oxide, polysilicon and silicon nitride is built up over the floating gate. A center hole is formed in the silicon nitride over the location of the floating gate and sidewall spacers are added to the walls of the center hole to make the diameter of the hole larger at the top and narrower at the bottom near the floating gate. The center hole is etched through to the floating gate and is partially filled with a sacrificial material. Because the center hole diameter is not uniform from top to bottom, the sacrificial material forms a depression at the center of the hole that is used to form the shape of the cathode tip of the micro vacuum tube. Support holes are formed in the sacrificial material around the peripheral of the center hole, and a conductive material such as polysilicon is formed over the sacrificial material including the depression at the center hole. The sacrificial material is etched away leaving a sharp conical shaped cathode tip formed from the deposition of the conductive material onto the depression in the sacrificial material and creating a void extending from the cathode tip to the floating gate. A high melting point metal is vacuum deposited over the conductive material forming the cathode tip sealing off the void in the hole under the cathode tip.

The shape of the cathode tip can be altered by changing the shape of the center hole before it is partially filled with the sacrificial material. For instance, an elongated hole having an oval like shape around its peripheral will produce a line like depression in the sacrificial material which when filled with the conductive material will produce an elongated cathode tip similar to a knife edge. This elongated cathode structure increases emission efficiency and provides for quicker charging of the floating gates.

The anode of the micro vacuum tube which forms the floating gate of flash memory cells can be implemented in several different ways. Each implementation entails locating a surface directly under the cathode tip that can be charged and can hold that charge for an extended period of time. In a first embodiment a floating gate is formed using polysilicon or other conductive material, and then a source and drain are formed on either side of the floating gate. The flash memory cell read using the source and drain in a standard fashion to supply current to a sense amplifier. In a second embodiment a floating gate is formed without a source or drain being formed. The cell is read by checking the re-programmability condition. If the cell is re-programmable, the floating gate must not be charged, otherwise it would be charged or programmed. In a third embodiment an area of ion implantation is made into the semiconductor substrate that accumulates charge from the tip of the micro vacuum tube. The cell is read by checking the re-programmability condition. If the cell is re-programmable, the ion implantation area must not be charged, otherwise it would be charged or programmed.

BRIEF DESCRIPTION OF THE DRAWINGS

This invention will be described with reference to the accompanying drawings, wherein.

DETAILED DESCRIPTION OF THE PREFERRED EMBODIMENT

Figure 1A:
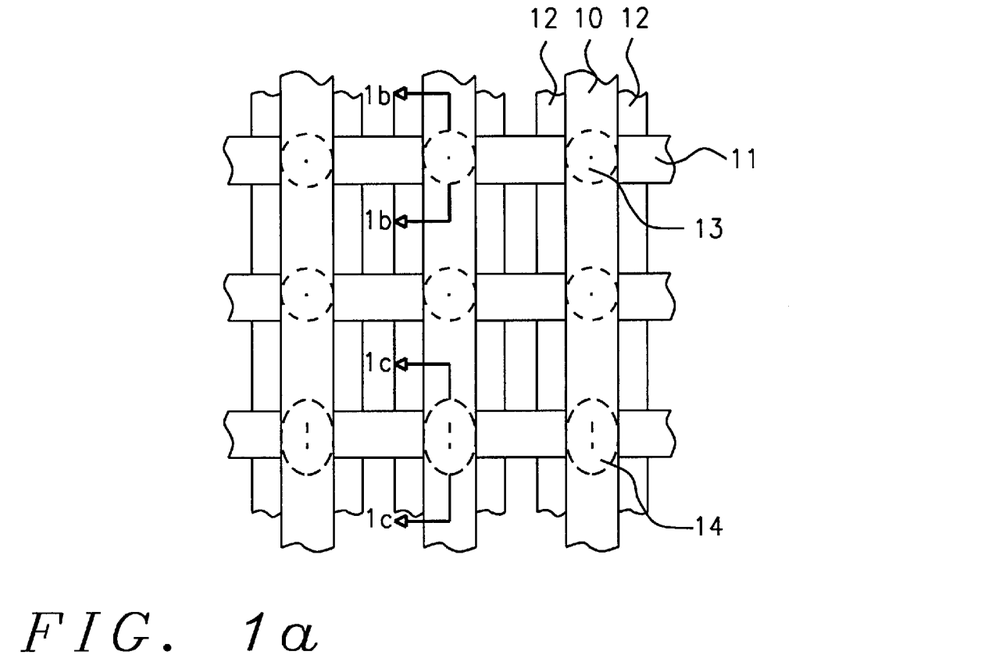
FIG. 1a–1d show a plan and cross section views of a first embodiment of a micro vacuum tube flash memory cell including voltages for programming, erasing and reading.

In FIG. 1a is shown a plan view of the first embodiment of this invention. Columns of tip gates 20 (FIG. 1b and 1c) are connected together with metalization 10 running the length of a column of micro vacuum tube flash memory cells 13 14. Rows of selector gates 23 (FIG. 1b and 1c) are connected together with metalization 11 running the length of a row of the micro vacuum tube flash memory cells 13 14. Sources and drains 27 (FIG. 1b and 1c) are interconnected by metalization 12 running the length of a column of the micro vacuum tube flash memory cells 13 14. There are two different styles of cathode tips shown for the flash memory cells. The first is a convex cusp shaped tip coming to a sharp point in a circular shaped micro vacuum tube 13, and the second is an elongated cusp shaped tip like a knife edge in an elliptical shaped micro vacuum tube 14. The circular and elliptical shape refers to the vacuum cavity and may or may not refer to the external shape of the micro vacuum tube.

Figure 1B:
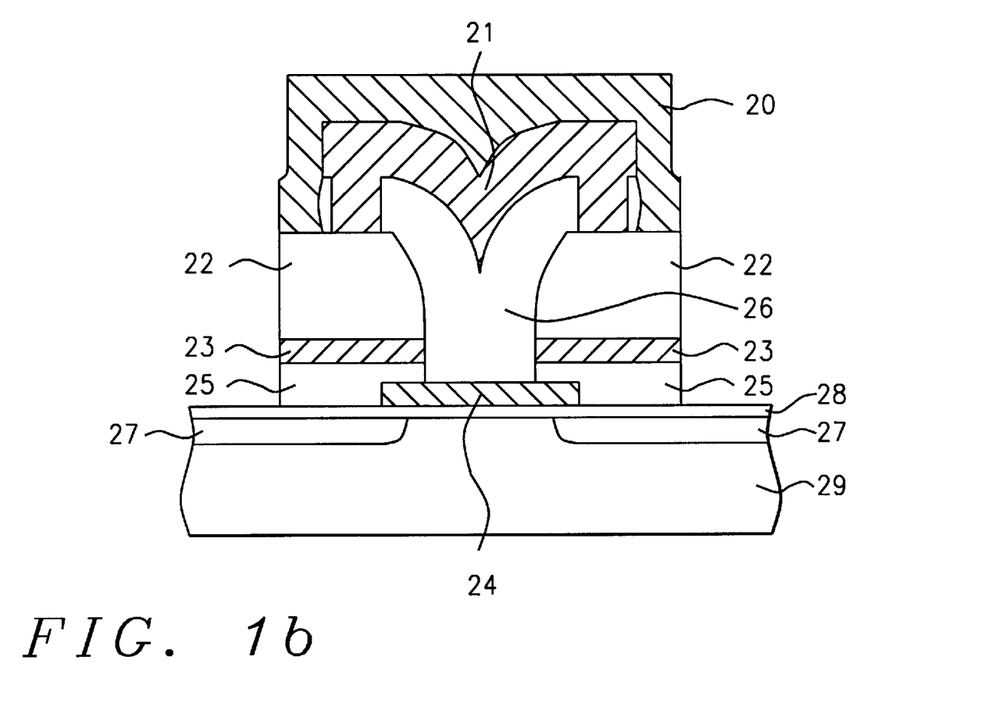

In FIG. 1b is shown a cross section view of the circular shaped micro vacuum tube 13 which contains a convex cusp shaped needle point cathode tip 21. The circular shaped micro vacuum tube 13 is formed on a semiconductor substrate 29 over a floating gate 24 of heavily doped polysilicon. The floating gate lies on top of a thin oxide 28 beneath which a source and drain 27 have been implanted into the semiconductor substrate 29. An oxide layer 25 is deposited over the floating gate 24 and a heavily doped layer of polysilicon 23 is formed on top of the oxide 25 to create a selector gate for the circular micro vacuum tube 13. A layer of silicon nitride 22 is formed over the selector gate 23. A cavity in the form of a circular hole 26 is formed in the silicon nitride 22 with an uneven diameter from top to bottom resulting from the use of sidewalls. The cavity 26 is continued through to the floating gate 24. The cavity 26 is filled with a sacrificial material forming a concave cusp at the center. The concave cusp when filled with a heavily doped polysilicon or a conductive metal forms the convex cusp 21 having a needle sharp point that becomes the cathode for the micro vacuum tube. The sacrificial material is etched away leaving a void in the cavity 26, and a metal cap 20 is vacuum deposited over the structure sealing the cavity 26 with a vacuum within, thus forming a micro vacuum tube over the floating gate 24. The metal cap 20 contacts the conductive material forming the convex cusp 21 and becomes the contact for the tip gate metalization 10 which runs the length of a column of micro vacuum tubes used as flash memory cells.

Figure 1C:
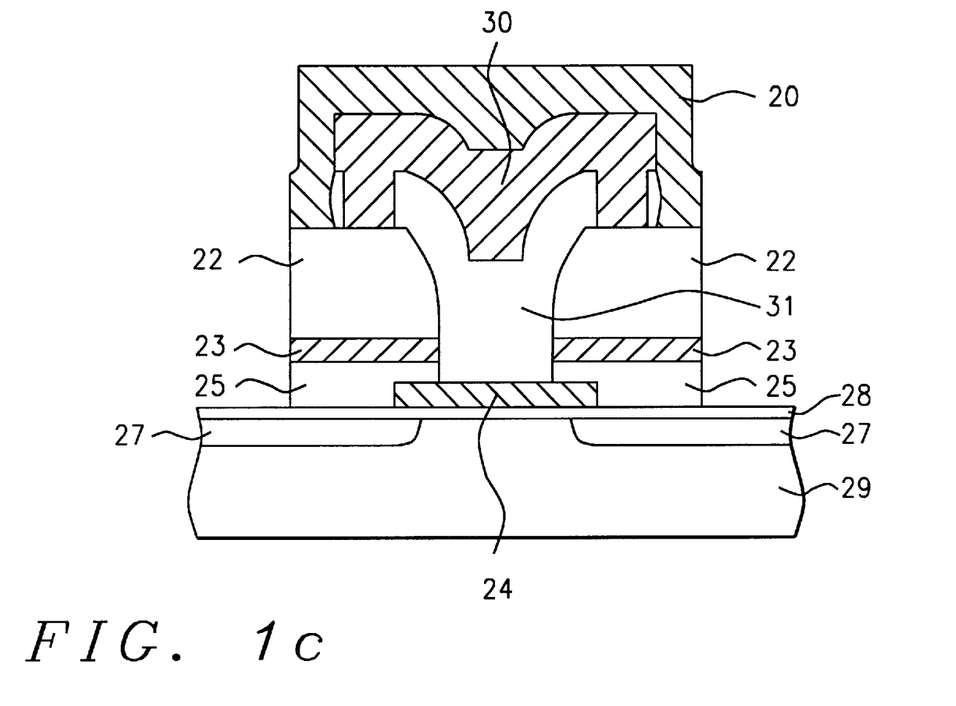

In FIG. 1c is shown a micro vacuum tube positioned over a floating gate similar to that shown in FIG. 1b except the cavity 31 is formed by an elliptical hole which leads to a line like cathode tip 30 where the tip ends in an elongated convex cusp like a sharp knife edge. This elongated tip produces more efficient emission form the cathode tip 30. The elliptical shaped micro vacuum tube 14 is formed on a semiconductor substrate 29 over a floating gate 24 of heavily doped polysilicon. The floating gate 24 lies on top of a thin oxide 28 beneath which a source and drain 27 have been implanted into the semiconductor substrate 29. An oxide layer 25 is deposited over the floating gate 24 and a heavily doped layer of polysilicon 23 is formed on top of the oxide 25 to create a selector gate for the elliptical micro vacuum tube 14. A layer of silicon nitride 22 is formed over the selector gate 23. A cavity in the form of an elliptical hole 31 is formed in the silicon nitride 22 with an uneven width and length from top to bottom resulting from the use of sidewalls. The cavity 31 is continued through to the floating gate 24. The cavity 31 is filled with a sacrificial material forming a concave line cusp at the center. The concave line cusp when filled with a heavily doped polysilicon or a conductive metal forms the convex line cusp 30 having a sharp knife like edge that becomes the cathode for the micro vacuum tube. The sacrificial material is etched away leaving a void in the cavity 31, and a metal cap 20 is vacuum deposited over the structure sealing the cavity 31 with a vacuum within, thus forming a micro vacuum tube over the floating gate 24. The metal cap 20 contacts the conductive material forming the convex line cusp 30 and becomes the contact for the tip gate metalization 10 which runs the length of a column of micro vacuum tubes used as flash memory cells.

Figure 1D:
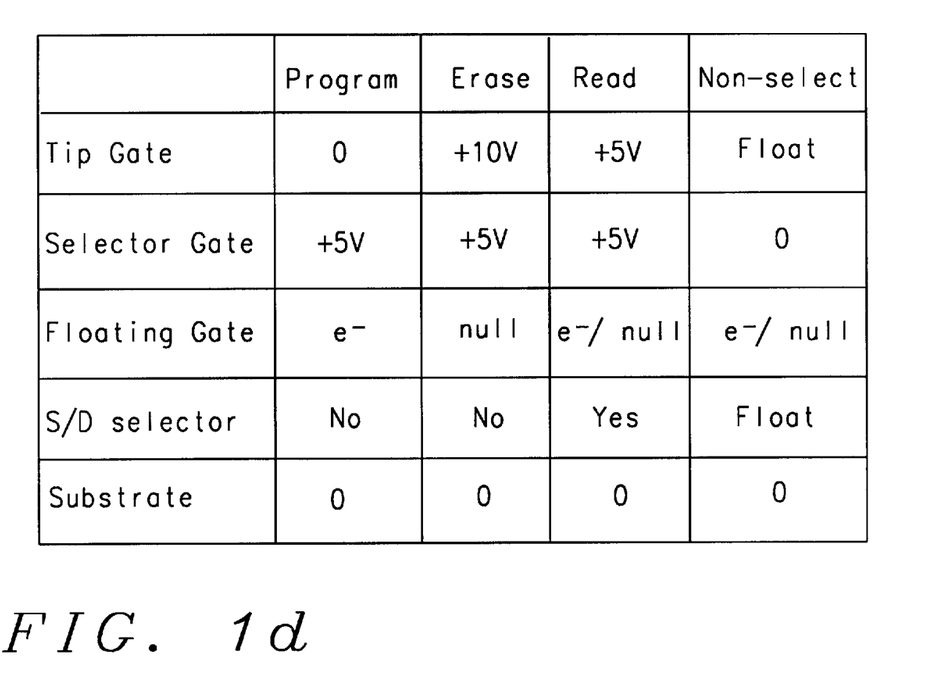

In FIG. 1d a chart is shown that provides the voltages necessary to program, erase, read and non select the micro vacuum tube flash memory cells 13 14 shown in cross section view in FIG. 1b and 1c. To program the flash memory cells 13 14 zero volts is applied to the tip gate 21 30 and a positive voltage preferably about 5 volts and being in a range of approximately 4 to 6 volts is applied to the selector gate 23. The floating gate is charged with electrons (e$^-$) and the source and drain is not selected with the substrate held at 0 volts. To erase the flash memory cells 13 14 a positive voltage preferably about 10 volts and being in a range of approximately 9 to 11 volts is applied to the tip gate 21 30. A positive voltage preferably about 5 volts and being in a range of approximately 4 to 6 volts is applied to the selector gate 23. The floating gate 24 is a "null" or without adequate electronic charge to be classified as being programmed. The source and drain are not selected and the semiconductor substrate is biased to zero volts. To read the flash memory cells 13 14 a positive voltage preferably about 5 volts and being in a range of approximately 4 to 6 volts is applied to the tip gate 21 30 and to the selector gate 23. The charge on the floating gate e$^-$ or a "null" determines the current flow between the source and drain 27 which is connected to the sense amplifiers of the flash memory through a decoder. The semiconductor substrate remains biased at zero volts. To non-select the flash memory cell 13 14 the tip gate and the source drain selector 27 are floated and the selector gate and semiconductor substrate are held at zero volts.

Figure 2A:
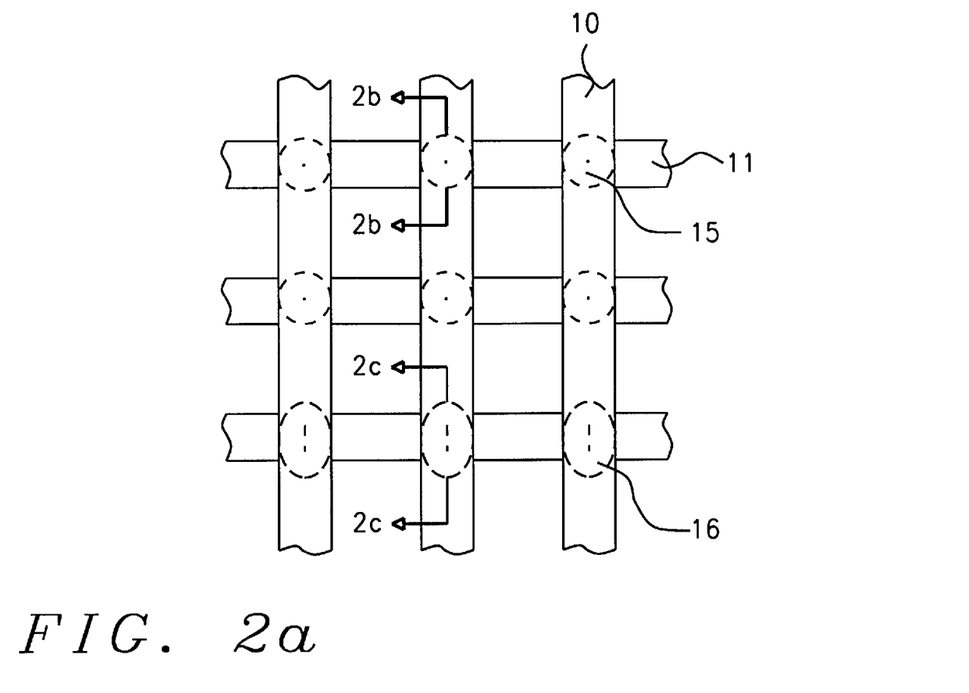
FIG. 2a–2d show a plan and cross section views of a second embodiment of a micro vacuum tube flash memory cell including voltages for programming, erasing and reading.

A second embodiment of this invention is shown in FIG. 2a, 2b, 2c and 2d. This second embodiment is very similar to the first embodiment except there is not any source and drain included in the micro vacuum tube flash memory cell. In FIG. 2a is shown a plan view of the second embodiment of this invention. Columns of tip gates 20 (FIG. 1b and 1c) are connected together with metalization 10 running the length of a column of micro vacuum tube flash memory cells 15 16. The columns are connected to sense amplifiers through decoders and provide a cell current read by the sense amplifiers to determine the information stored in the cell. Rows of selector gates 23 (FIG. 1b and 1c) are connected together with metalization 11 running the length of a row of the micro vacuum tube flash memory cells 15 16. The rows are word lines that are used to select cells or non-select cells for flash memory operations. There are two different styles of cathode tips shown for the flash memory cells. The first is a convex cusp shaped tip coming to a sharp point in a circular shaped micro vacuum tube 15, and the second is an elongated cusp shaped tip like a knife edge in an elliptical shaped micro vacuum tube 16. The circular and elliptical shape refers to the vacuum cavity and may or may not refer to the external shape of the micro vacuum tube.

Figure 2B:
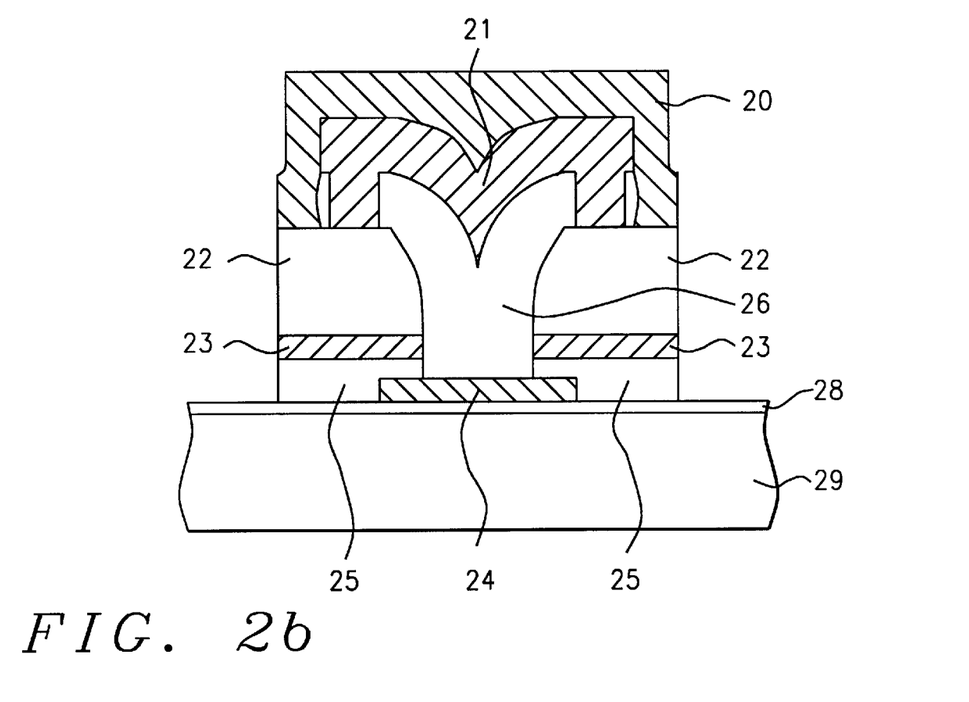

In FIG. 2b is shown a cross section view of the circular shaped micro vacuum tube 15 which contains a convex cusp shaped needle point cathode tip 21. The circular shaped micro vacuum tube 15 is formed on a semiconductor substrate 29 over a floating gate 24 of heavily doped polysilicon. The floating gate lies on top of a thin oxide 28. An oxide layer 25 is deposited over the floating gate 24 and a heavily doped layer of polysilicon 23 is formed on top of the oxide 25 to create a selector gate for the circular micro vacuum tube 15. A layer of silicon nitride 22 is formed over the selector gate 23. A cavity in the form of a circular hole 26 is formed in the silicon nitride 22 with an uneven diameter from top to bottom resulting from the use of sidewalls. The cavity 26 is continued through to the floating gate 24. The cavity 26 is filled with a sacrificial material forming a concave cusp at the center. The concave cusp when filled with a heavily doped polysilicon or a conductive metal forms the convex cusp 21 having a needle sharp point that becomes the cathode tip for the micro vacuum tube. The sacrificial material is etched away leaving a void in the cavity 26, and a metal cap 20 is vacuum deposited over the structure sealing the cavity 26 with a vacuum within, thus forming a micro vacuum tube over the floating gate 24. The metal cap 20 contacts the conductive material forming the convex cusp 21 and becomes the contact for the tip gate metalization 10 which runs the length of a column of micro vacuum tubes used as flash memory cells.

Figure 2C:
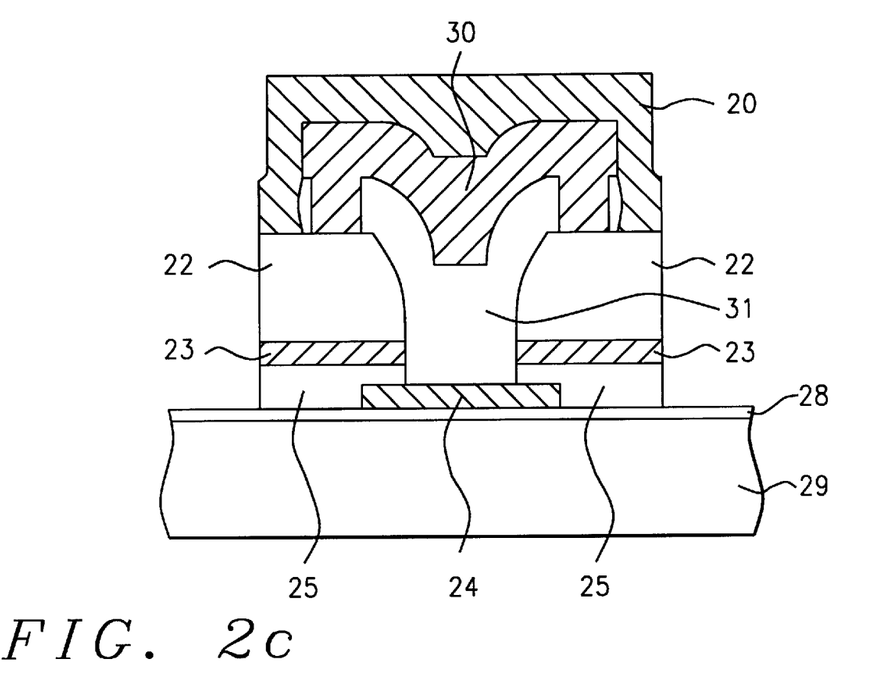

In FIG. 2c is shown a micro vacuum tube positioned over a floating gate similar to that shown in FIG. 2b except the cavity 31 is formed by an elliptical hole which leads to a line like cathode tip 30 where the tip ends in an elongated convex cusp like a sharp knife edge. This elongated tip produces more efficient emission of electrons from the cathode tip 30. The elliptical shaped micro vacuum tube 16 is formed on a semiconductor substrate 29 over a floating gate 24 of heavily doped polysilicon. The floating gate 24 lies on top of a thin oxide 28. An oxide layer 25 is deposited over the floating gate 24 and a heavily doped layer of polysilicon 23 is formed on top of the oxide 25 to create a selector gate for the elliptical micro vacuum tube 16. A layer of silicon nitride 22 is formed over the selector gate 23, and a cavity in the form of an elliptical hole 31 is formed in the silicon nitride 22 with an uneven width and length from top to bottom resulting from the use of sidewalls. The cavity 31 is continued through to the floating gate 24, and is filled with a sacrificial material forming a concave line cusp at the center. The concave line cusp when filled with a heavily doped polysilicon or a conductive metal forms the convex line cusp 30 having a sharp knife like edge that becomes the cathode for the micro vacuum tube. The sacrificial material is etched away leaving a void in the cavity 31, and a metal cap 20 is vacuum deposited over the structure sealing the cavity 31 with a vacuum within, thus forming a micro vacuum tube over the floating gate 24. The metal cap 20 contacts the conductive material forming the convex line cusp 30 and becomes the contact for the tip gate metalization 10 which runs the length of a column of micro vacuum tubes used as flash memory cells.

Figure 2D:
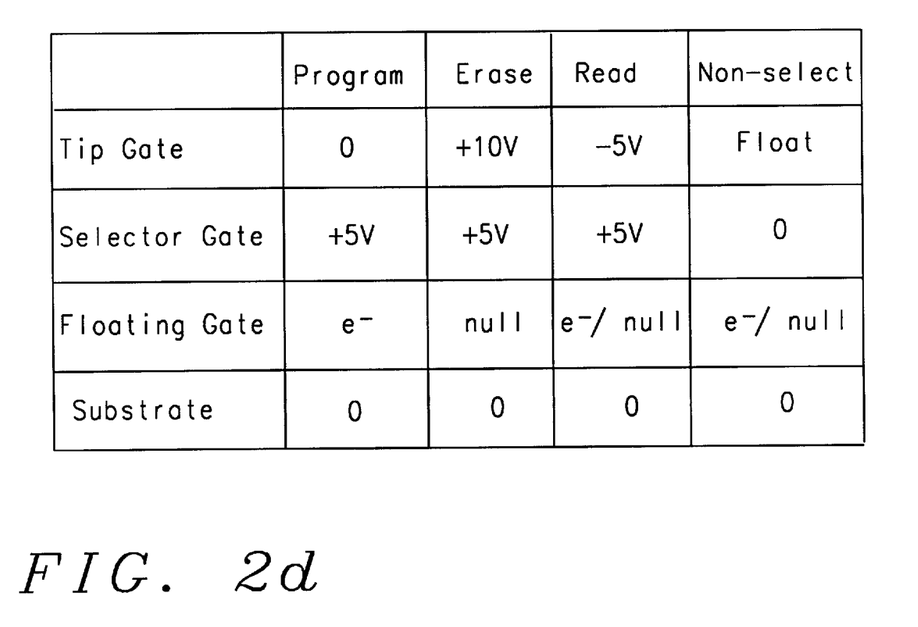

In FIG. 2d a chart is shown that provides the voltages necessary to program, erase, read and non select the micro vacuum tube flash memory cells 15 16 shown in cross section view in FIG. 2b and 2c. To program the flash memory cells 15 16 zero volts is applied to the tip gate 21 30 and a positive voltage preferably about 5 volts and being in a range of approximately 4 to 6 volts is applied to the selector gate 23. The floating gate 24 is charged with electrons (e⁻) and the substrate is held at 0 volts. To erase the flash memory cells 15 16 a positive voltage preferably about 10 volts and being in a range of approximately 9 to 11 volts is applied to the tip gate 21 30. A positive voltage preferably about 5 volts and being in a range of approximately 4 to 6 volts is applied to the selector gate 23. The floating gate 24 is a "null" or without adequate electronic charge to be classified as being programmed. The semiconductor substrate bias is zero volts. To read the flash memory cells 15 16 a negative voltage is applied to the tip gate 21 30, preferably about −5 volts and being in a range of approximately −4 to −6 volts. A positive voltage preferably about 5 volts and being in a range of approximately 4 to 6 volts is applied to the selector gate 23. The charge on the floating gate e⁻ or a "null" determines the current flow between the tip gate 21 30 and the selector gate 23 which is connected to the sense amplifiers of the flash memory through a decoder. The semiconductor substrate remains biased at zero volts. To non-select the flash memory cell 15 16 the tip gate is floated and the selector gate and semiconductor substrate are held at zero volts.

Figure 3A:
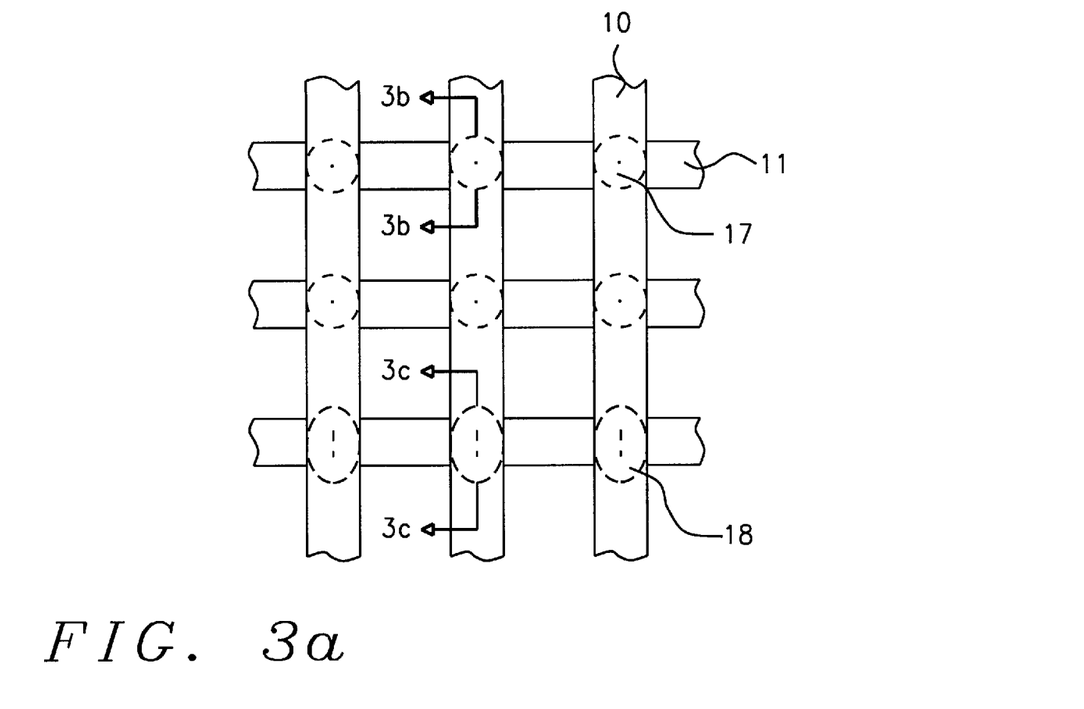
FIG. 3a–3d show a plan and cross section views of a third embodiment of a micro vacuum tube flash memory cell including voltages for programming, erasing and reading.

A third embodiment of this invention is shown in FIG. 3a, 3b, 3c and 3d. This third embodiment is very similar to the second embodiment except the floating gate 24 is replaced by diffusion 32 contained within the semiconductor substrate 29. In FIG. 3a is shown a plan view of the third embodiment of this invention. Columns of tip gates 20 (FIG. 3b and 3c) are connected together with metalization 10 running the length of a column of micro vacuum tube flash memory cells 17 18. The columns are connected to sense amplifiers through decoders and provide a cell current read by the sense amplifiers to determine the information stored in the cell. Rows of selector gates 23 (FIG. 3b and 3c) are connected together with metalization 11 running the length of a row of the micro vacuum tube flash memory cells 17 18. The rows are word lines that are used to select cells or non-select cells for flash memory operations. There are two different styles of cathode tips shown for the flash memory cells. The first is a convex cusp shaped tip coming to a sharp point in a circular shaped micro vacuum tube 17, and the second is an elongated cusp shaped tip like a knife edge in an elliptical shaped micro vacuum tube 18. The circular and elliptical shape refers to the vacuum cavity and may or may not refer to the external shape of the micro vacuum tube.

Figure 3B:
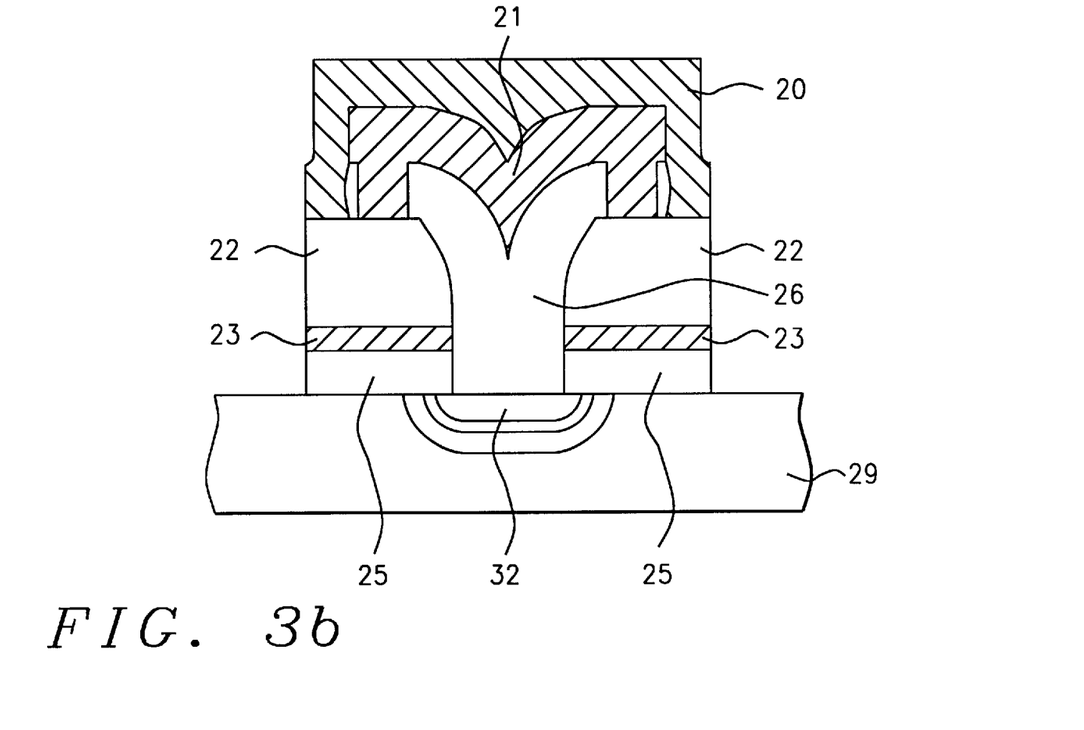

In FIG. 3b is shown a cross section view of the circular shaped micro vacuum tube 17 which contains a convex cusp shaped needle point cathode tip 21. The circular shaped micro vacuum tube 17 is formed on a semiconductor substrate 29 over a diffused area 32 located in the semiconductor substrate 29. An oxide layer 25 is deposited on the surface of the substrate 29 and a heavily doped layer of polysilicon 23 is formed on top of the oxide 25 to create a selector gate for the circular micro vacuum tube 17. A layer of silicon nitride 22 is formed over the selector gate 23. A cavity in the form of a circular hole 26 is formed in the silicon nitride 22 with an uneven diameter from top to bottom resulting from the use of sidewalls. The cavity 26 is continued through to top surface of the substrate 29. The cavity 26 is filled with a sacrificial material forming a concave cusp at the center. The concave cusp when filled with a heavily doped polysilicon or a conductive metal forms the convex cusp 21 having a needle sharp point that becomes the cathode tip for the micro vacuum tube. The sacrificial material is etched away leaving a void in the cavity 26, and a metal cap 20 is vacuum deposited over the structure sealing the cavity 26 with a vacuum within, thus forming a micro vacuum tube over the floating gate 24. The metal cap 20 contacts the conductive material forming the convex cusp 21 and becomes the contact for the tip gate metalization 10 which runs the length of a column of micro vacuum tubes used as flash memory cells.

Figure 3C:
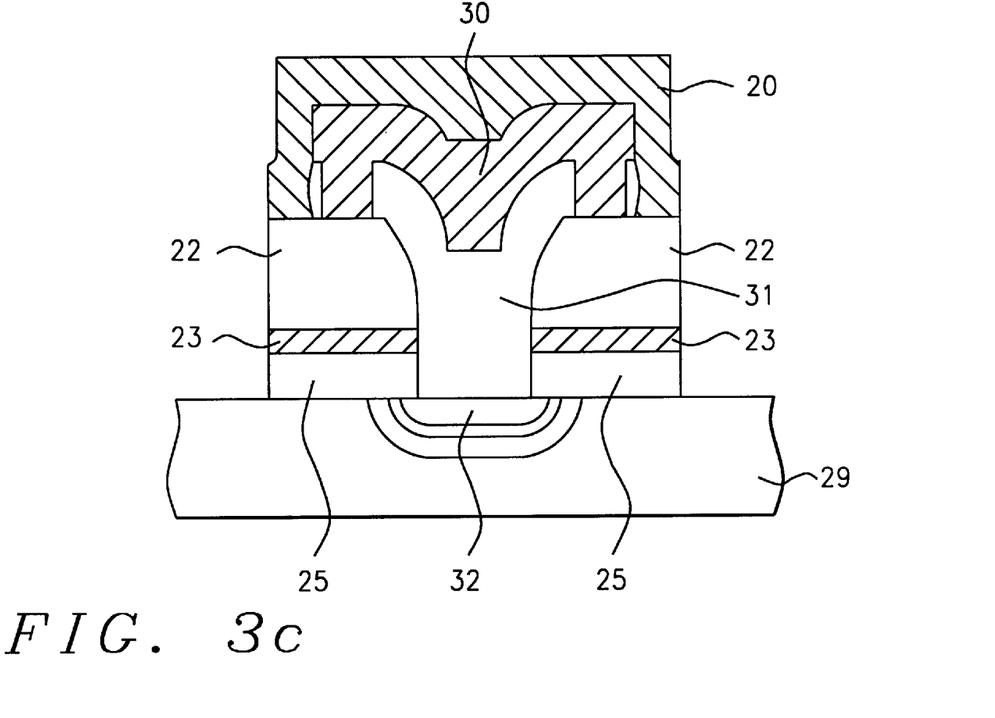

In FIG. 3c is shown a micro vacuum tube positioned over a diffusion 32 in the semiconductor substrate 29 similar to that shown in FIG. 3b except the cavity 31 is formed by an elliptical hole which leads to a line like cathode tip 30 where the tip ends in an elongated convex cusp like a sharp knife edge. This elongated tip produces more efficient emission of electrons from the cathode tip 30. The elliptical shaped micro vacuum tube 18 is formed on the semiconductor substrate 29 over the diffusion area 32. An oxide layer 25 is deposited on top of the substrate 29 and a heavily doped layer of polysilicon 23 is formed on top of the oxide 25 to create a selector gate for the elliptical micro vacuum tube 18. A layer of silicon nitride 22 is formed over the selector gate 23, and a cavity in the shape of an elliptical hole 31 is formed in the silicon nitride 22 with an uneven width and length from top to bottom resulting from the use of sidewalls. The cavity 31 is continued through to the top surface of the substrate 29 and the diffusion 32, and is filled with a sacrificial material forming a concave line cusp at the center. The concave line cusp when filled with a heavily doped polysilicon or a conductive metal forms the convex line cusp 30 having a sharp knife like edge that becomes the cathode for the micro vacuum tube. The sacrificial material is etched away leaving a void in the cavity 31, and a metal cap 20 is vacuum deposited over the structure sealing the cavity 31 with a vacuum within, thus forming a micro vacuum tube over the diffusion 32. The metal cap 20 contacts the conductive material forming the convex line cusp 30 and becomes the contact for the tip gate metalization 10 which runs the length of a column of micro vacuum tubes used as flash memory cells.

Figure 3D:
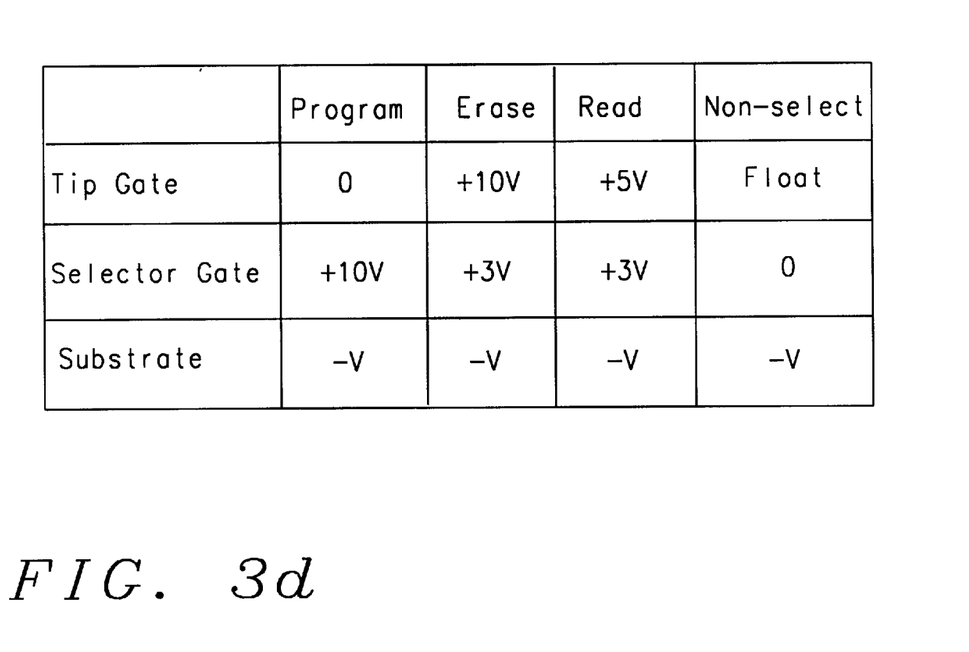

In FIG. 3d a chart is shown that provides the voltages necessary to program, erase, read and non select the micro vacuum tube flash memory cells 17 18 shown in cross section view in FIG. 3b and 3c. To program the flash memory cells 17 18 zero volts is applied to the tip gate 21 30 and a positive voltage preferably about 10 volts and being in a range of approximately 9 to 11 volts is applied to the selector gate 23. The diffusion 32 is charged with electrons (e⁻) and the substrate is biased to a negative voltage. To erase the flash memory cells 17 18 a positive voltage preferably about 10 volts and being in a range of approximately 9 to 11 volts is applied to the tip gate 21 30. A positive voltage preferably about 3 volts and being in a range of approximately 2 to 4 volts is applied to the selector gate 23. The diffusion 32 is a "null" or without adequate electronic charge to be classified as being programmed. The semiconductor substrate is bias at a negative voltage. To read the flash memory cells 17 18 a positive voltage is applied to the tip gate 21 30, preferably about 5 volts and being in a range of approximately 4 to 6 volts. A positive voltage preferably about 3 volts and being in a range of approximately 2 to 3 volts is applied to the selector gate 23. The charge on the floating gate, e⁻ or a "null", determines the current flow between the tip gate 21 30 and the selector gate 23 which is connected to the sense amplifiers of the flash memory through a decoder. The semiconductor substrate remains biased at a negative voltage. To non-select the flash memory cell 17 18 the tip gate is floated, the selector gate is biased at zero volts and the semiconductor substrate is biased at a negative voltage.

While the invention has been particularly shown and described with reference to preferred embodiments thereof, it will be understood by those skilled in the art that various changes in form and details may be made without departing from the spirit and scope of the invention.

What is claimed is:

1. A flash memory cell using micro vacuum tube technology, comprising:
   a) a floating gate formed on top of a thin oxide on a semiconductor substrate,
   b) a source and drain implanted in said semiconductor substrate,
   c) a micro vacuum tube formed on top of said semiconductor substrate over said floating gate,
   d) a selector gate controlling electron flow from a cathode tip of said micro vacuum tube,
   e) said floating gate charged by means of electron flow from said cathode tip,
   f) said source and drain providing bit line current,
   g) said selector gate connected to a word line of a flash memory.

2. The flash memory cell of claim 1, wherein said cathode tip is a convex cusp like needle tip.

3. The flash memory cell of claim 1, wherein said cathode tip is an elongated convex cusp like line type tip.

4. The flash memory cell of claim 1, wherein said source and drain are not implanted into said substrate and said flash memory cell is read by detecting the amount of current flowing between said selector gate and said cathode tip.

5. A micro vacuum tube flash memory cell, comprising:
   a) a floating gate formed on top of a thin oxide on a semiconductor substrate,
   b) a micro vacuum tube formed on top of said semiconductor substrate over said floating gate,
   c) a selector gate controlling electron flow from a cathode tip of said micro vacuum tube,
   d) said floating gate charged by means of electron flow from said cathode tip,
   e) said cathode tip providing bit line current,
   g) said selector gate connected to a word line of a flash memory.

6. The flash memory cell of claim 5, wherein said cathode tip can be either a convex cusp point type tip or an elongated convex cusp line type tip.

7. The flash memory cell of claim 5, wherein said floating gate is replaced by a diffusion in the semiconductor substrate.

* * * * *